(12) United States Patent (10) Patent No.: US 8,440,535 B2
Dennison (45) Date of Patent: May 14, 2013

(54) FORMING A PHASE CHANGE MEMORY WITH AN OVONIC THRESHOLD SWITCH

(75) Inventor: Charles H. Dennison, San Jose, CA (US)

(73) Assignee: Ovonyx, Inc., Sterling Heights, MI (US)

( * ) Notice: Subject to any disclaimer, the term of this patent is extended or adjusted under 35 U.S.C. 154(b) by 0 days.

(21) Appl. No.: 13/463,072

(22) Filed: May 3, 2012

(65) Prior Publication Data

US 2012/0220099 A1     Aug. 30, 2012

Related U.S. Application Data

(62) Division of application No. 11/262,246, filed on Oct. 28, 2005, now Pat. No. 8,188,454.

(51) Int. Cl.
 *H01L 21/20* (2006.01)
 *H01L 21/00* (2006.01)
 *H01L 21/06* (2006.01)

(52) U.S. Cl.
 USPC ............ 438/381; 438/102; 438/95; 438/131; 438/900; 257/E31.029

(58) Field of Classification Search .................. 438/381
 See application file for complete search history.

(56) References Cited

U.S. PATENT DOCUMENTS

| | | | |
|---|---|---|---|
| 5,714,768 A | 2/1998 | Ovshinsky et al. | |
| 5,970,336 A * | 10/1999 | Wolstenholme et al. | 438/238 |
| 6,567,293 B1 * | 5/2003 | Lowrey et al. | 365/100 |
| 6,569,705 B2 * | 5/2003 | Chiang et al. | 438/95 |
| 6,795,338 B2 | 9/2004 | Parkinson et al. | |
| 7,190,048 B2 * | 3/2007 | Campbell | 257/613 |
| 7,274,034 B2 * | 9/2007 | Campbell et al. | 257/4 |
| 7,354,793 B2 * | 4/2008 | Campbell | 438/102 |
| 7,374,174 B2 * | 5/2008 | Liu et al. | 257/5 |
| 7,491,962 B2 * | 2/2009 | Liu et al. | 257/2 |
| 7,642,622 B2 * | 1/2010 | Yi et al. | 257/613 |
| 7,880,123 B2 * | 2/2011 | Kim et al. | 219/497 |
| 7,939,815 B2 * | 5/2011 | Lee et al. | 257/2 |
| 2004/0067608 A1 * | 4/2004 | Dennison | 438/128 |
| 2004/0114413 A1 * | 6/2004 | Parkinson et al. | 365/100 |
| 2006/0226410 A1 * | 10/2006 | Wicker et al. | 257/2 |
| 2006/0289848 A1 * | 12/2006 | Dennison | 257/3 |
| 2007/0029676 A1 * | 2/2007 | Takaura et al. | 257/758 |

* cited by examiner

*Primary Examiner* — Leonard Chang
*Assistant Examiner* — Evren Seven
(74) *Attorney, Agent, or Firm* — Trop, Pruner & Hu, P.C.

(57) ABSTRACT

A phase change memory may include an ovonic threshold switch formed over an cyanic memory. In one embodiment, the switch includes a chalcogenide layer that overlaps an underlying electrode. Then, edge damage, due to etching the chalcogenide layer, may be isolated to reduce leakage current.

8 Claims, 5 Drawing Sheets

FORMING A PHASE CHANGE MEMORY WITH AN OVONIC THRESHOLD SWITCH

CROSS-REFERENCE TO RELATED APPLICATION

This application is a divisional of U.S. patent application Ser. No. 11/262,246, filed on Oct. 28, 2005 now U.S. Pat. No. 8,188,454.

BACKGROUND

This invention relates generally to phase change memory devices.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

In one embodiment, memory elements may comprise a phase change material. In this embodiment, the memory may be referred to as a phase change memory. A phase change material may be a material having electrical properties (e.g. resistance, capacitance, etc.) that may be changed through the application of energy such as, for example, heat, light, voltage potential, or electrical current. The phase change material may include a chalcogenide material.

A chalcogenide alloy may be used in a memory element or in an electronic switch. A chalcogenide material may be a material that includes at least one element from column VI of the periodic table or may be a material that includes one or more of the chalcogen elements, e.g., any of the elements of tellurium, sulfur, or selenium.

Figure 1:
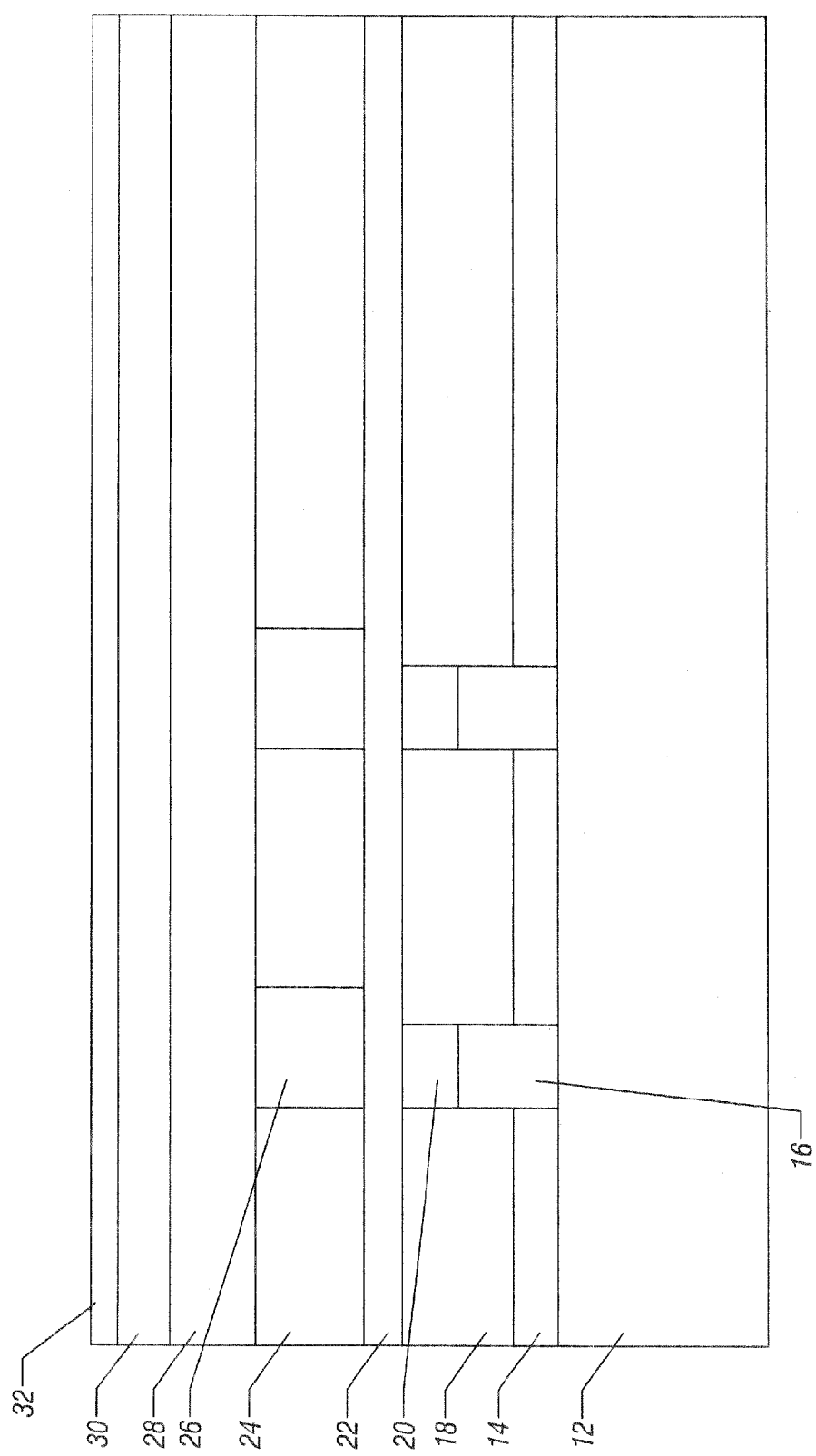
FIG. 1 is an enlarged, cross-sectional view at an early stage of manufacture in accordance with one embodiment of the present invention.

Referring to FIG. 1, in accordance with one embodiment of the present invention, a planar insulator (not shown), such as an interlayer dielectric, may be overlaid by a row line conductor or lower electrode 12. The row line conductor 12 may be chemical vapor deposited titanium silicon nitride. In one embodiment, the row line conductor may be about 2500 Angstroms in thickness. Overlying the row line conductor 12 may be a planar insulator 14. Another insulator 18 may be formed over the insulator 14. In one embodiment, the insulator 18 is thicker then the insulator 14.

In one embodiment, the insulators 14 and 18 are blanket deposited, patterned, and etched to form openings which are filled by the resistive plugs 16. These resistive plugs 16 constitute the lower electrode of a phase change memory cell. In other words, each plug 16 may be used as the lower electrode of a different phase change memory cell. The plugs 16 may be made of material which is oxidizable such as chemical vapor deposited titanium silicon nitride or titanium nitride.

The plug 16 may be formed in a pore in the insulators 18 and 14. The upper portion of the pore may be filled with a chalcogenide material 20. Initially, the phase change memory material or chalcogenide material 20 may be deposited, for example, to a thickness of 500 Angstroms and then planarized.

The resulting structure may be covered by the other electrode 22. Then, the electrode 22 may be deposited, for example, to a thickness of 300 Angstroms. The electrode 22 may be TiAlN (titanium aluminum nitride) or a composite film of Ti/TiN (titanium/titanium nitride) in one embodiment. Next, in some embodiments, a barrier film (not shown) may be formed. The barrier film may be up to 100 Angstroms in thickness in some cases. That structure may then be covered by another insulator 24, punctuated by pores filled by second conductive plugs 26 (such as tungsten, TiN, or TiSiN).

Then, a second chalcogenide layer 28 may be formed. In one embodiment, the second chalcogenide layer 28 may be used to form an ovonic threshold switch. Overlying the second chalcogenide layer 28 is a top electrode 30. Covering everything shown in FIG. 1 is an optional hard mask 32 in one embodiment of the present invention.

Figure 2:
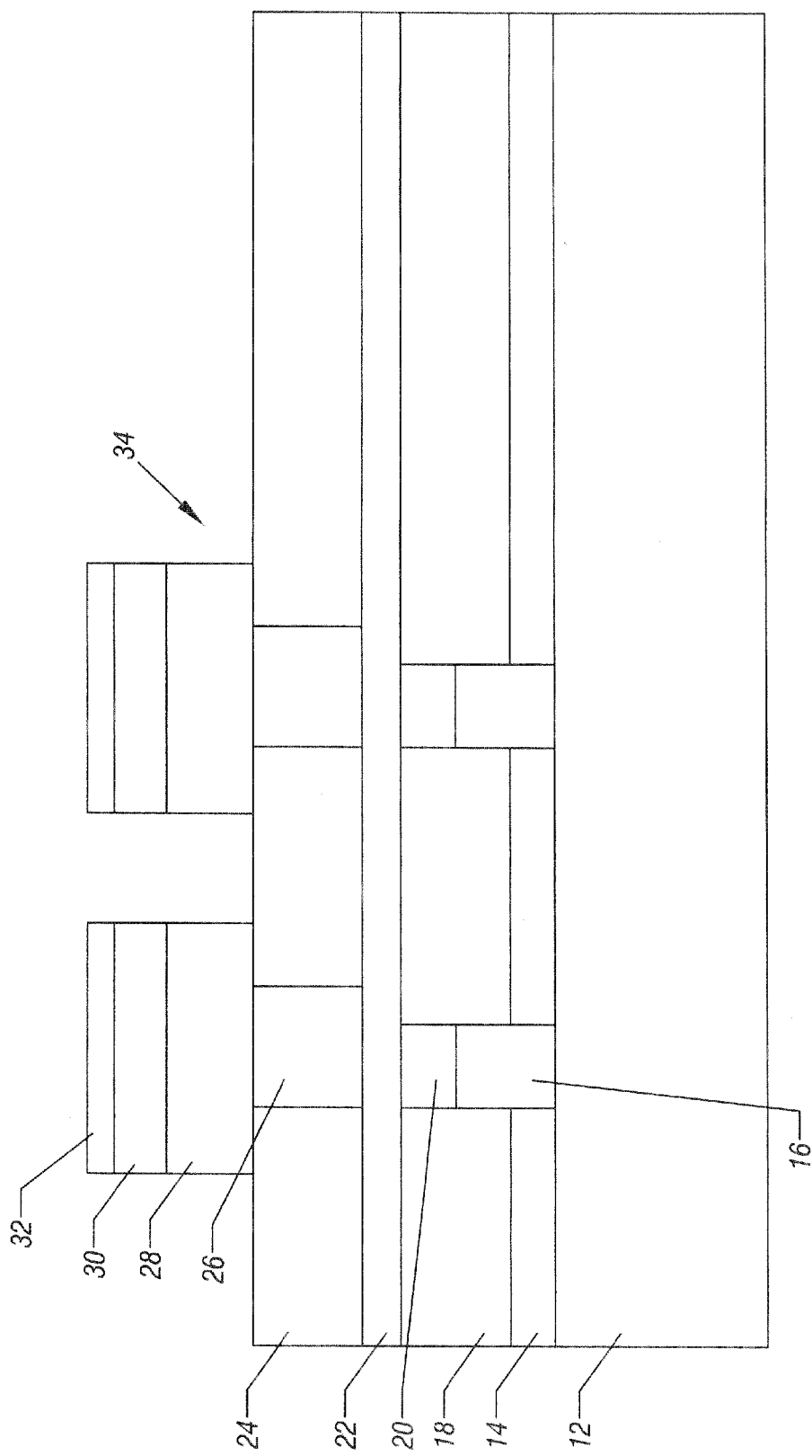
FIG. 2 is an enlarged, cross-sectional view at a subsequent stage in accordance with one embodiment of the present invention.

Referring to FIG. 2, a stack of layers 34 may be deposited and etched using the hard mask 32. In some embodiments, the hard mask may be nitride or oxynitride and/or a composite oxide/nitride layer. The hard mask 32 may itself be patterned by a resist mask (not shown) in one embodiment. The stack of layers 34 may form a phase change memory cell and/or a select device which, in one embodiment, may be an ovonic threshold switch.

In an embodiment using an ovonic threshold switch, an ovonic threshold switch lower electrode or plug 26 may be deposited. In one embodiment, the lower electrode or plug 26 may be formed of tungsten and may be 300 Angstroms thick in one embodiment. Next, the ovonic threshold switch (OTS) chalcogenide material 28 may be deposited. It may be a chalcogenide, such as 1040' chalcogenide (AsTeGeSi, $As_2Te_3Ge$, or $As_2Se_3Ge$), which is 500 Angstroms thick in one embodiment. It may be formed of a material which does not change phase. Finally, an upper electrode 30 may be deposited. It may be formed of TiAlN or a composite film of Ti/TiN, titanium, or titanium nitride in some embodiments. For example, it may be between 50 and 2000 Angstroms thick.

The etched structure may define the OTS stack 34 which may be formed using the patterned hard mask 32. Inc etching may stop on the layer 24 in one embodiment.

Figure 3:
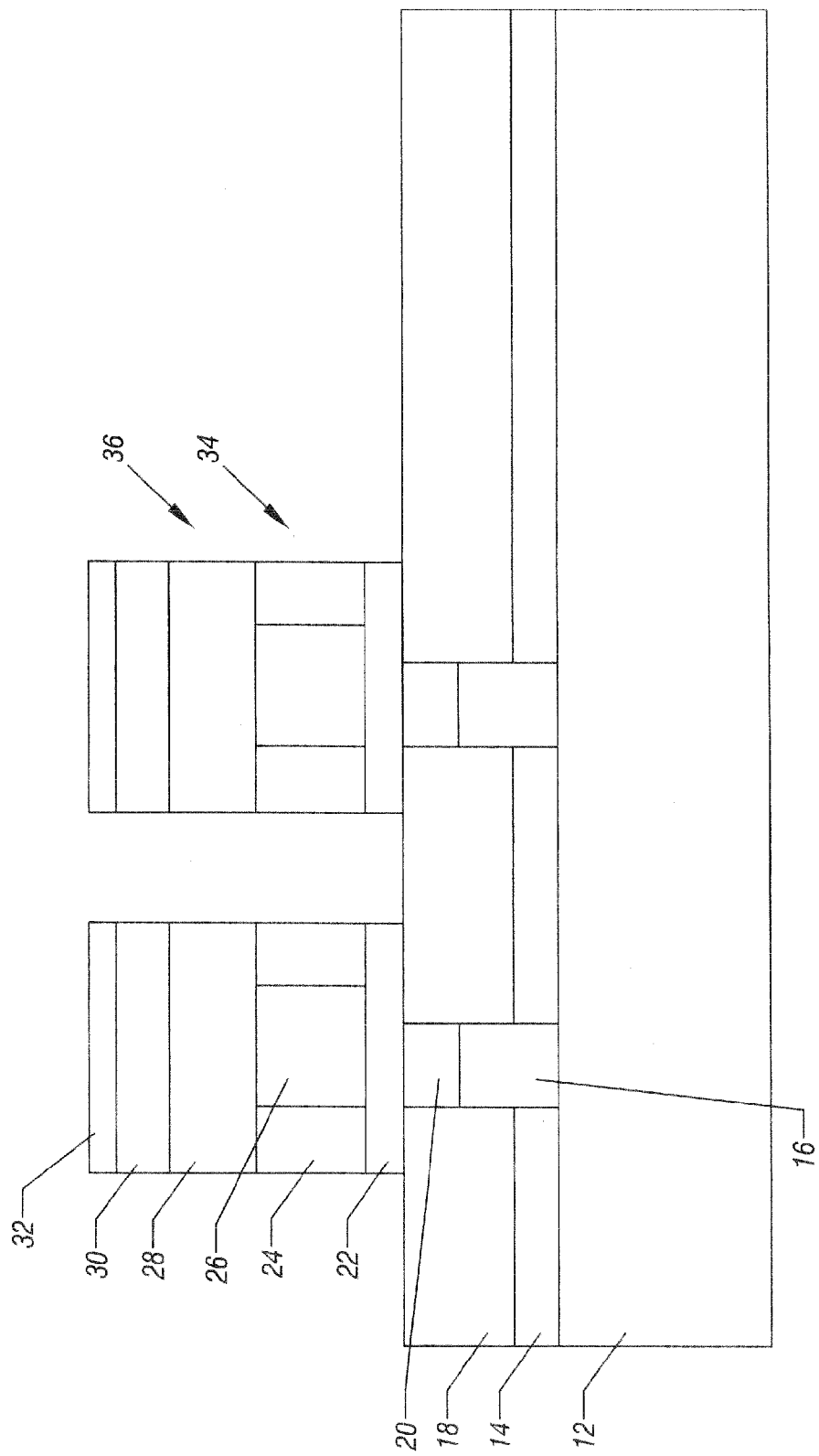
FIG. 3 is an enlarged, cross-sectional view at a subsequent stage in accordance with one embodiment of the present invention.

Referring to FIG. 3, the structure shown in FIG. 2 may be patterned and etched to define a large number of memory array cells, although only two are shown in FIG. 3. In one embodiment, the cells may be defined by the patterned hard mask 32 which is applied over the upper electrode 30. Next, the upper electrode 30 is etched, using the pre-patterned hard mask 32 as a mask in some embodiments. The etch proceeds down to the layer 18. This forms a structure including the plug 26 isolated from exposure at the etched edges by the insulating layer 24. The hard mask 32 may be removed.

The plug 26 may be off center to some degree relative to the stack 34. However, it is desirable that the plug 26 be centered sufficiently to be flanked by insulator 24 on both sides. The insulator 24 effectively isolates the overlying edge regions of the chalcogenide layer 28. Since that layer 28 could have been damaged during the etch, it is now electrically isolated or neutralized. The only electrically effective region of the chalcogenide layer 28 is the portion overlying the plug 26. This isolation may reduce undesirable current leakage.

An ovonic threshold switch (OTS) 36 is defined over a still unsingulated ovonic unified memory (OUR) switch including the chalcogenide material 20 in one embodiment. However, the etch of the OTS 36 may also etch and define the common electrode 22 between the OTS 36 and the OUM. As a result, an etching step to separately etch the electrode 22 may be eliminated in some embodiments.

Figure 4:
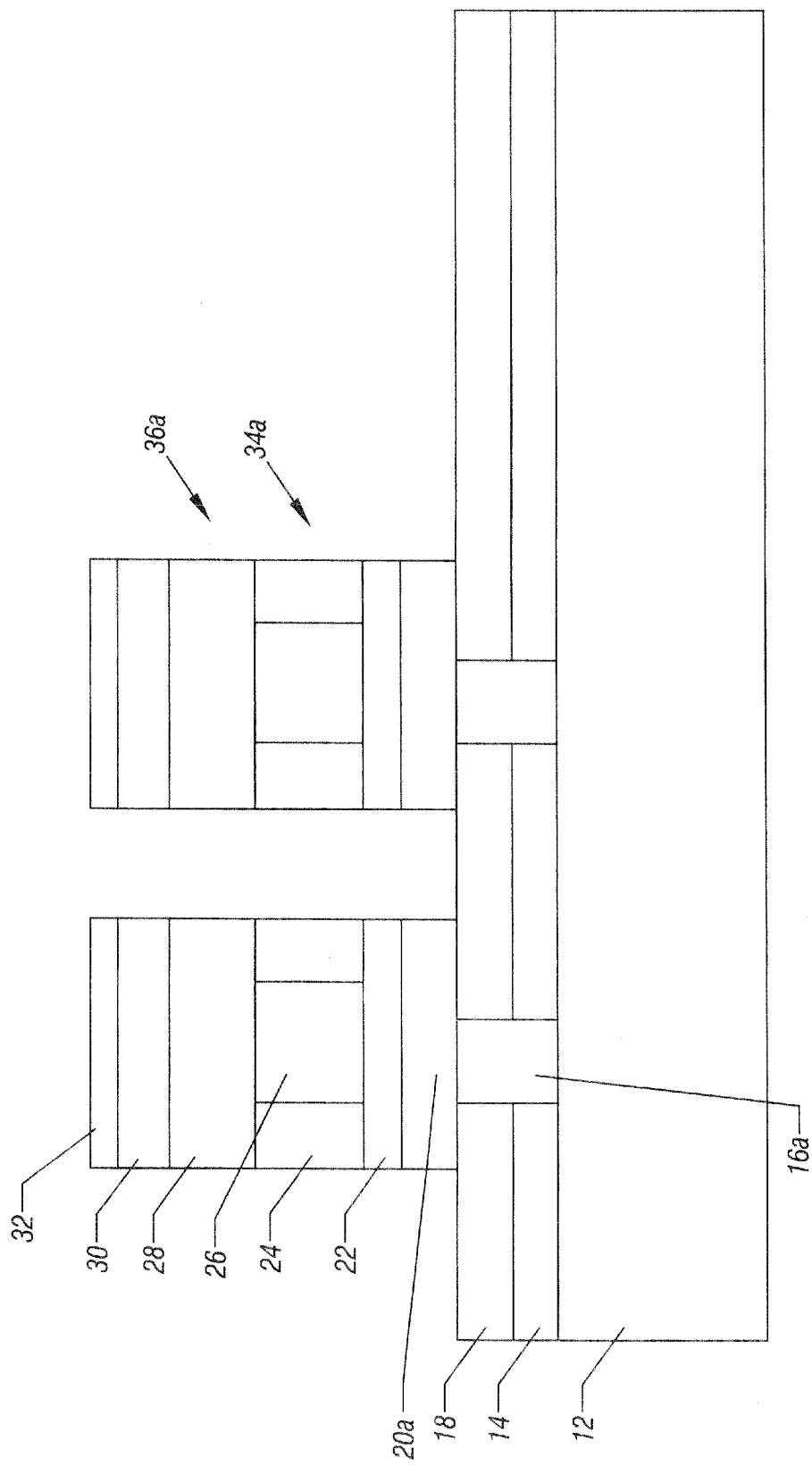
FIG. 4 is an enlarged, cross-sectional view at a subsequent stage in accordance with one embodiment of the present invention.

To further illustrate that embodiments of the present invent on may be implemented in a variety of cell architectures, an implementation in connection with, what may be called a lance bottom GUM electrode, is illustrated in FIG. 4.

Over a row line conductor 12 may be formed the insulators 14 and 18, as described previously. However, instead of forming the lance or plug 16 to partially fill a pore, which ultimately is filled by the chalcogenide material 20, the lance 16a may itself completely fill the pore as shown in FIG. 4. Then, a at of a chalcogenide material 20a, followed by an electrode 22, followed by the components described in connection with FIGS. 1-3, may be formed. Next, the entire stack may be etched down to the insulator 18 so that the chalcogenide material 20a is part of a stack or dot structure 34a. The only unetched portion, in some embodiments, may be the portion from the layer 18, including the lance 16a, down. The lance 16a acts as the heater for the phase change material 20a overlying it. Of course, only two cells are shown in FIG. 4, but many more cells would be formed in practice.

As in the embodiment of FIGS. 1-3, the chalcogenide material 28, in the embodiment of FIG. 4, becomes isolated by the lateral insulator 24 regions. This insulator 24 isolates the overlying regions of the chalcogenide material 28. Thus, any etching damage to the lateral edges of the chalcogenide material 28 is electrically isolated by the underlying insulator 24. Since conductivity will be between the row line conductor 12 and the electrode 30 through the chalcogenide layer 28, the plug 26, the electrode 22, the chalcogenide layer 20a, and the lance 16a, the current conduction path bypasses the portion of the chalcogenide layer 28 overlying the remaining portions of the insulator 24.

This bypassing of the edges of the layer 28 may reduce or even eliminate the OTS edge current leakage. This may be especially so if the overlap of the dot or etched stack 36a to the lance 16a is greater than one-half of the thickness of the chalcogenide layer 28.

In some embodiments, there may be no yield issue with column over-etch causing electrical shorts to the bottom OTS electrode 22 because the bottom OTS electrode 22 is no longer the same size as the overlying plug 20.

Less OTS leakage may achieved due to the reduced bottom OTS electrode size in some embodiments.

When combined with a bottom OUM device, the number of masking steps may be reduced due to the top OTS electrode and top OUM electrode 22 being defined in a single lithographic and etch step.

In some embodiments, the OTS layer 28 may be deposited rev physical vapor deposition. This may result in a well defined layer thickness.

The series connected select device in the form of the OTS 36 or 36a may be used to access a memory element in the form of the OUM during programming or reading of memory element. Its select device may be an ovonic threshold switch that can be made of a chalcogenide alloy that does not exhibit an amorphous to crystalline phase change and which undergoes rapid, electric field initiated change in electrical conductivity that persists only so long as a holding voltage is present.

A select device may operate as a switch that is either "off" or "on" depending on the amount of voltage potential applied across the memory cell, and more particularly whether the current through the select device exceeds its threshold current or voltage, which then triggers the device into the on state. The off state may be a substantially electrically nonconductive state and the on state may be a substantially conductive state, with less resistance than the off state.

In the on state, the voltage across the select device is equal to its holding voltage. $V_H$ plus IxRon, where Ron is the dynamic resistance from the extrapolated X-axis intercept, $V_h$. For example, a select device may have threshold voltages and, if a voltage potential less than the threshold voltage of a select device is applied across the select device, then the select device may remain "off" or in a relatively high resistive state so that little or no electrical current passes through the memory cell and most of the voltage drop from selected row to selected column is across the select device. Alternatively, if a voltage potential greater than the threshold voltage of a select device is applied across the select device, then the select device may "turn on," i.e., operate in a relatively low resistive state no that electrical current passes through the memory cell. In other words, one or more series connected select devices may be in a substantially electrically nonconductive state if less than a predetermined voltage potential, e.g., the threshold voltage, is applied across select devices. Select devices may be in a substantially conductive state if greater than the predetermined voltage potential is applied across select devices. Select devices may also be referred to as an access device, an isolation device, or a switch.

In one embodiment, each select device may comprise a switching material such as, for example, a chalcogenide alloy, and may be referred to as an ovonic threshold switch, or simply an ovonic switch. The switching material of select devices may be a material in substantially amorphous state positioned between two electrodes that may be repeatedly and reversibly switched between a higher resistance "off" state (e.g., greater than about ten megaOhms) and a relatively lower resistance "on" state about one thousand Ohms in series with $V_H$) by application of a predetermined electrical current or voltage potential. In this embodiment, each select device may be a two terminal device that may have a current-voltage (I-V) characteristic similar to a phase change memory element that is in the amorphous state. However, unlike a phase change memory element, the switching material of select devices may not change phase. That is, the switching material of select devices may not be a programmable material, and, as a result, select devices may not be a memory device capable of storing information. For example, the switching material of select devices may remain permanently amorphous and the I-V characteristic may remain the same throughout the operating life.

In the low voltage or low electric field mode, i.e., where the voltage applied across select device is less than a threshold voltage (labeled $V_{TH}$), a select device may be "off" or non-conducting, and exhibit a relatively high resistance, e.g., greater than about 10 megaOhms. The select device may remain in the off state until a sufficient voltage, e.g., $V_{TH}$, is applied, or a sufficient current is applied, e.g., $I_{TH}$, that may switch the select device to a conductive, relatively low resistance on state. After a voltage potential of greater than about $V_{TH}$ is applied across the select device, the voltage potential across the select device may drop ("snapback") to a holding voltage potential, $V_H$. Snapback may refer to the voltage difference between $V_{TH}$ and $V_H$ of a select device.

In the on state, the voltage potential across select device may remain close to the holding voltage of $V_H$ as current passing through select device is increased. The select device may remain on until the current through the select device drops below a holding current, $I_H$. Below this value, the select device may turn off and return to a relatively high resistance, nonconductive off state until the $V_{TH}$ and $I_{TH}$ are exceeded again.

In some embodiments, only one select device may be used. In other embodiments, more than two select devices may be used. A single select device may have a $V_H$ about equal to its threshold voltage, $V_{TH}$, (a voltage difference less than the threshold voltage of the memory element) to avoid triggering a reset bit when the select device triggers from a threshold voltage to a lower holding voltage called the snapback voltage. An another example, the threshold current of the memory element may be about equal to the threshold current of the access device even though its snapback voltage is greater than the memory element's reset bit threshold voltage.

Programming of the chalcogenide 20 or 20a to alter the state or phase of the material may b accomplished by applying voltage potentials to the lower electrode 12 and upper electrode 30, thereby generating a voltage potential across the select device and memory element. When the voltage potential is greater than the threshold voltages of select device and memory element, then an electrical current may flow through the chalcogenide material 20, 20a in response to the applied voltage potentials, and may result in heating of the chalcogenide material 20, 20a.

This heating may alter the memory state or phase of the chalcogenide material 20, 20a. Altering the phase or state of the chalcogenide material 20, 20a may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in an a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphosize memory material and "reset" memory material (e.g., program memory material to a logic "0" value). Floating the volume of memory material to a relatively lower crystallization temperature may crystallize memory material and "set" memory material (e.g., program memory material to a logic "1" value). Various resistances of memory material may be achieved to store information by varying the mount of current flow and duration through the volume of memory material.

Figure 5:
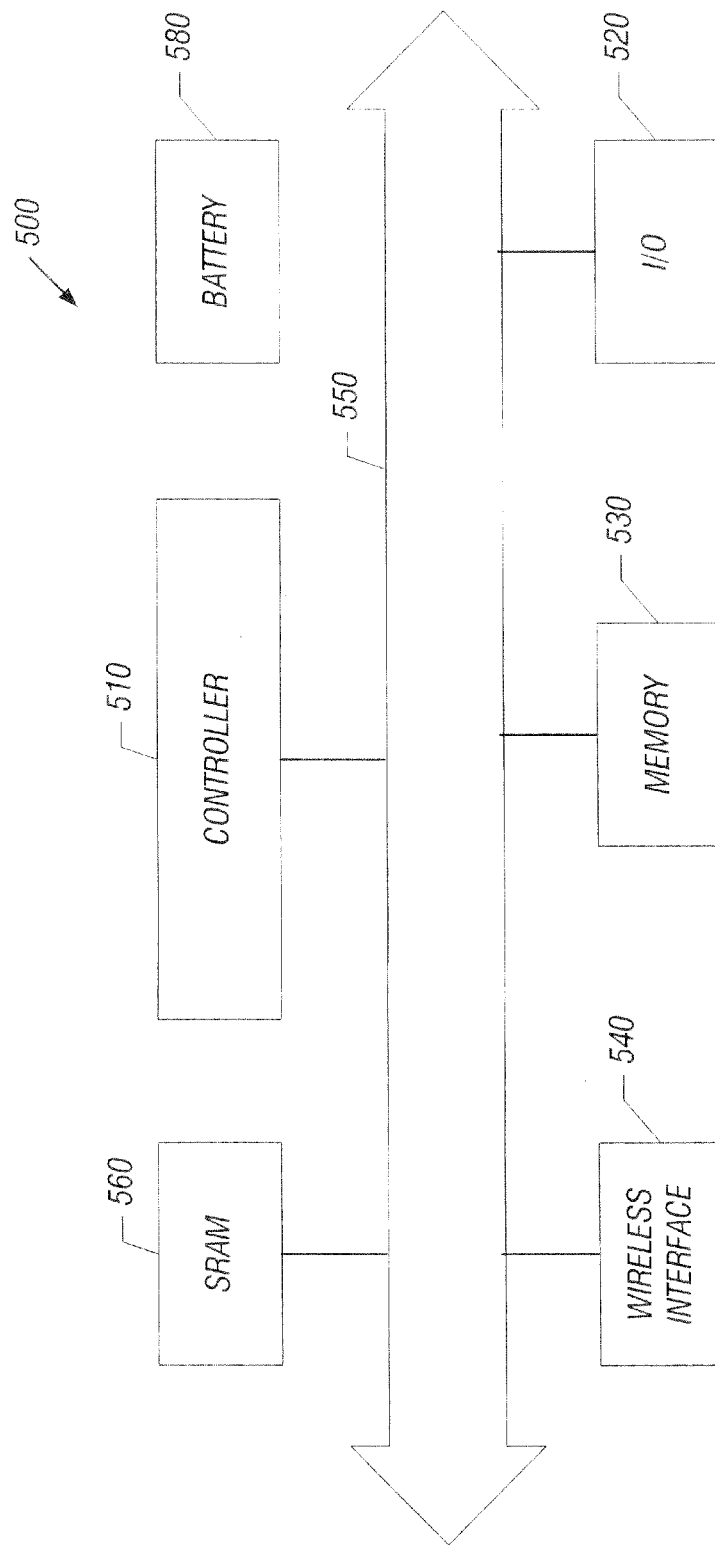
FIG. 5 is a system depiction of one embodiment of the present invention.

Turning to FIG. 5, a portion of a system 500 in accordance with an embodiment of the present invent on is described. System 500 may be used in wireless devices such as, for example, a personal digital assistant (SPA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is riot limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 sic cc used to store messages transmitted to or by system 500. Memory 530 may also optionally be used to store instructions that are executed by controller 510 during the operation of system 500, and may be used to store user data. Memory 550 may be provided by one or more different types of memory. For example, memory 530 may comprise any type of random access memory, a volatile memory, a non-volatile memory such as a flash memory and/or a memory such as memory discussed herein.

I/O device 520 may be used by a user to generate a message. System 500 may use wireless interface 540 to transmit and receive messages to and from a wireless communication network with a radio frequency (PS) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    forming an ovonic threshold switch device including a chalcogenide layer and a plug wherein the chalcogenide layer overlaps the plug on two opposed sides;
    forming an ovonic memory device directly underlying said ovonic threshold switch device; and
    forming said ovonic memory device including a chalcogenide layer which is defined to have a dimension in common with said ovonic threshold switch device.

2. The method of claim 1 including forming a common electrode between said ovonic memory device and ovonic threshold switch device.

3. The method of claim 2 including etching a stack of layers to form said ovonic threshold switch device.

4. The method of claim 3 including etching said common electrode during the same etch used to etch said stack.

5. The method of claim 4 including etching said common electrode using the same mask used to etch said stack.

6. The method of claim 5 including using a hard mask to etch said stack.

7. The method of claim 1 including forming said ovonic memory including a pore having a chalcogenide layer and an electrode in said pore.

8. The method of claim 1 including forming said ovonic memory with a pore filled with an electrode.

\* \* \* \* \*